United States Patent [19]

Turley

[11] Patent Number: 4,613,387
[45] Date of Patent: Sep. 23, 1986

[54] INJECTION LASER MANUFACTURE
[75] Inventor: Stephen E. H. Turley, Harlow, England
[73] Assignee: ITT Industries Inc., New York, N.Y.
[21] Appl. No.: 470,758
[22] Filed: Feb. 28, 1983
[51] Int. Cl.[4] .......................................... H01L 21/208
[52] U.S. Cl. .................. 148/171; 29/569 L; 148/172; 372/46
[58] Field of Search .............. 148/171, 172; 29/569 L; 372/46

[56] References Cited

U.S. PATENT DOCUMENTS

| | | | |
|---|---|---|---|
| 3,998,672 | 12/1976 | Miyoshi | 148/171 |
| 4,276,098 | 6/1981 | Nelson et al. | 148/171 |
| 4,321,556 | 3/1982 | Sakuma | 29/569 L X |
| 4,326,176 | 4/1982 | Aiki et al. | 372/45 |
| 4,354,898 | 10/1982 | Coldren et al. | 29/569 L X |
| 4,454,603 | 6/1984 | Marschall et al. | 372/46 |

Primary Examiner—George T. Ozaki
Attorney, Agent, or Firm—John T. O'Halloran; Robert P. Seitter

[57] ABSTRACT

A method of making an (In,Ga)(As,P) inverted rib waveguide laser in which a lateral waveguiding effect is provided by an inverted rib formed in intermediate index material spacing the active layer from the substrate which accommodates the rib in a channel in the substrate includes forming the channel with {111}B or {011} plane side walls, thereby permitting the use of a thinner intermediate index material layer than is possible when using a channel with {111}A plane sides.

3 Claims, 2 Drawing Figures

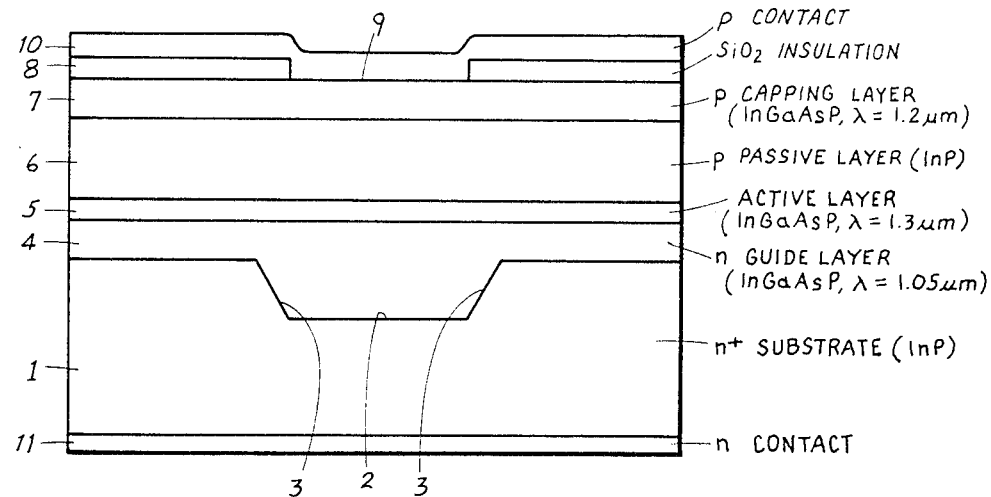

INJECTION LASER MANUFACTURE

BACKGROUND OF THE INVENTION

This invention relates to injection laser manufacture and in particular to the manufacture of an (In,Ga)(As,P) laser having the structure referred to sometimes as an Inverted Rib Waveguide (IRW) laser, and also referred to as a Plano-Convex Waveguide (PCW) laser.

An IRW laser is characterized by having, between the active layer and the substrate, an intermediate layer which provides a measure of dielectric waveguiding effect in the lateral direction by virtue of a rib formed in its surface facing the substrate, this rib extending into a material of lower refractive index. In the case of (In,Ga)(As,P) lasers grown upon InP substrates, the low refractive index of InP relative to that of (In,Ga)(AsP) makes it possible to adopt a relatively simple structure in which the intermediate layer is grown directly onto the surface of the substrate so that its rib extends into the substrate material.

The manufacture of (In,Ga)(As,P) IRW lasers has been described by M. Ueno et al in IEEE Journal of Quantum Electronics, Vol. QE-17, No. 9, pp. 1930–40 (September 1981), by K. Sakai et al in the same Journal, Vol. QE-17, No. 7, pp. 1245–50 (July, 1981), and by Y. Noda et al in Electronics Letters, Vol. 17, No. 6, pp. 226–7 (March 1981). However, the approaches described in these articles have certain disadvantages which will be discussed in some detail later and which are overcome by the present invention.

SUMMARY OF THE INVENTION

Accordingly, it is a general object of the present invention to avoid the disadvantages of the prior art.

More particularly, it is an object of the present invention to provide an inverted rib waveguide laser which does not possess the disadvantages of the known lasers of this type.

Still another object of the present invention is so to construct the laser of the type here under consideration as to be able to keep the thickness of an intermediate layer situated between an active layer and a substrate of the laser, and thus between the active layer and a rib of the intermediate layer which achieves a measure of lateral waveguiding effect, to a minimum.

It is yet another object of the present invention to develop a method of producing a laser of the above type, which achieves relatively rapid and excellent liquid epitaxy growth of the intermediate layer material especially in a channel of the substrate during the formation of the rib, and which results in the formation of a planar surface of the intermediate layer facing away from the substrate for the formation of the active layer thereon.

A concomitant object of the present invention is to devise a method of the above type which is easy to accomplish, inexpensive to perform, can be accomplished on already existing equipment, and achieves reliable results nevertheless.

In pursuance of these objects and others which will become apparent hereafter, one feature of the present invention resides in a method of producing an inverted rib waveguide laser including an InP substrate having a (100) surface, and an (In,Ga)(As,P) active layer, this method including the steps of forming at the (100) surface of the substrate a channel extending in the [011] direction by an etching process producing side walls of the channel that deviate from A-planes; epitaxially growing in the channel and on the (100) surface of the substrate an (In,Ga)(As,P) intermediate layer of larger band gap material than that of the active layer to thereby form a rib filling the channel and providing a measure of dielectric waveguiding effect for the laser in the lateral direction; and providing the active layer on the intermediate layer.

According to another aspect of the present invention there is provided in an inverted rib waveguide laser including an InP substrate having a (100) surface, and an (In,Ga)(As,P) active layer, the combination comprising means for bounding at the (100) surface, of the substrate a channel extending in the [011] direction, including side walls deviating from A-planes; and an (In,Ga)(As,P) intermediate layer of larger band gap material than that of the active layer on the (100) surface of the substrate and in the channel forming a rib filling the channel and providing a measure of dielectric waveguiding effect for the laser in the lateral direction, the active layer being provided on the intermediate layer.

In the articles referred to above, it has not been specified whether the orientation is such that the rib extends in a [01$\bar{1}$] or a [011] direction along the (100) plane. We have found that there is a distinct advantage in using the [011] direction rather than the [01$\bar{1}$]. A channel extending in the [01$\bar{1}$] direction is readily etched to a reproducible shape having A-plane side walls, whereas when etching a channel extending in the [011] direction the side walls may be A-plane, B-plane, (01$\bar{1}$) and (0$\bar{1}$1) planes, or some mixture of these, depending upon the nature of the etchant and the nature of the masking material used to delineate the channel. The difference between {111}A and {111}B faces affects the growth characteristics. Liquid phase epitaxy of InP and its related alloys is normally based on solutions in liquid In metal, so that the concentration of In in the system is much higher than that of P. The attachment of a new atom to both types of the {111} surface is relatively weak, since it consists of a single bond. The high concentration of In in the liquid would be expected to increase the probability of attachment of In atoms to a {111}B surface, whereas the probability of attaching P atoms to produce nucleation on a {111}A surface is much lower. For this reason growth on {111}A faces does not occur readily. Growth on {011} surfaces can be initiated by the attachment of either In or P atoms and thus growth occurs readily.

The slow growth of material on A-planes means that a channel with A-plane sides is not filled by subsequent liquid phase epitaxial growth nearly as quickly as when the sides are formed by planes deviating from A-planes. This in turn means that adequate filling of the channel to produce a substantially planar surface upon which the active layer can be grown requires the use of a thicker intermediate layer when filling channels with A-plane sides than when filling channels with differently oriented sides. This problem of growing sufficient material to provide a planar surface upon which the active layer can be grown is expressly referred to in the Ueno et al article to which previous reference has been made, and the authors of that article stated that they found it necessary to grow a layer whose thickness beyond the confines of the channel was greater than the depth of the channel formed in the substrate. We have found that this restriction can be avoided by using channels which do not have A-plane sides. Remembering that the laser must be designed so that the optical field extends deep enough for the rib to have the requisite lateral waveguiding effect, a consequence of being able to use a thinner intermediate layer is that the rib can be closer to the active layer, thereby relaxing a design constraint by making possible the use of designs in which the optical field does not have to extend so far from the active layer.

BRIEF DESCRIPTION OF THE DRAWING

Above-mentioned and other features and objects of this invention will become more apparent by reference to the following description taken in conjunction with the accompanying sole FIGURE of the drawing which is a diagrammatic cross-sectional view of a laser according to the present invention.

DETAILED DESCRIPTION OF THE PREFERRED EMBODIMENT

Referring now to the drawing in detail, it may be seen that the reference numeral 1 has been used therein to identify a substrate. A (100) surface of an n+-type wafer of InP, which is to form the substrate 1 of the laser, is polished and then etched in a bromine-methanol etch to remove approximately 10 microns of material that may have suffered polish damage. A silica masking layer (not shown) is then pyrolytically deposited on the substrate 1 from a mixture of oxygen and silane in nitrogen at a temperature of typically 400°–450° C. Windows extending in the [011] direction are etched through the mask with buffered hydrofluoric acid etch. Typically these windows are 2.75 microns wide. Then the etch is changed for a 1:1 hydrobromic: phosphoric acid etch (50% and 85% concentrated, respectively) to form channels 2 extending in the [011] direction in the substrate 1. This etch slightly undercuts the mask and leaves {111}B channel walls 3. (Each laser requires only one channel but in accordance with conventional semiconductor device manufacturing processing many devices are made at the same time on a single wafer which is subsequently divided up to give the individual devices.) The ability of this etchant to undercut the mask appears to be important to achieve the production of the {111}B sides, for if (In,Ga) (As,P) deposited by liquid phase epitaxy is used as the masking material, little if any undercutting occurs, and {111}A walls are produced instead of {111}B ones. In view of the propensity of the etch to produce etch pits at dislocations, it is desirable to choose a substrate with a low dislocation density. This is usually achieved by using a highly sulphur doped substrate 1. The etch time is usually quite short (typically between 5 and 10 seconds) to produce a channel 2 typically about 0.5 microns deep. After this the silica mask is removed with buffered hydrofluoric acid and then the substrate 1 is given a short etch (typically 20 seconds) in 0.1% bromine by volume in methanol to remove damage that may have occurred during the deposition of the mask. It is believed that this final etch also improves growth quality. It results in a slight rounding of channel shoulders which may ease LPE growth at the sides of the channel 2.

At this stage the channelled substrate wafer 1 is ready for the growth of its epitaxial layers and is mounted in a liquid phase epitaxy reactor. The first layer to be grown is an intermediate or guide layer 4 of lattice matched n-type (In,Ga)(As,P) material having a composition whose luminescence peak is centered at about 1.05 microns. This layer 4 is typically grown to a thickness of about 0.3 microns in regions remote from the channel 2, and by virtue of the face that the channel walls, 3 are not A-plane walls this thickness is sufficient to provide a substantially planar upper surface to the layer 4 notwithstanding the fact that this thickness is not as great as the depth of the channel 2. The next layer to be grown is an active layer 5, typically about 0.24 microns thick of lattice matched (In,Ga)(As,P) material typically having a composition whose luminescence peak is centered at about 1.3 microns. This active layer 5 is in turn covered by p-type passive and capping layers 6 and 7. The passive layer 6 is a low refractive index layer made of indium phosphide as is typically 1.5 microns thick while the capping layer 7 is made of lattice matched (In,Ga)(As,P) material typically having a composition whose luminescence peak is centered at 1.2 microns, or of (In,Ga) As material. In either instance the capping layer 7 is typically 0.3 microns thick.

The next stage of manufacture involves depositing an electrically insulating silica mask layer 8 and opening up windows 9 in that layer 8 to register with the channel 2. The silica material of the mask layer 8 is deposited by a plasma deposition process. The windows 9 are opened up with buffered hydrofluoric acid, using conventional photolithography.

If the growth of the epitaxial layers 4, 5, 6 and 7 has been prevented from extending right to the edge of the wafer 1, for instance by arranging for the wafer 1 to extend a few millimeters under the walls of the sliding boat containing the melts, then the requisite registry of the windows 9 with the grooves 2 can be obtained simply by visually aligning the mask with the channels 2 of the substrate wafer 1 where they lie exposed to view at the periphery of the wafer 1.

If, however, the epitaxy has been allowed to proceed up to the edge of the wafer 1, a preliminary processing stage is required to remove a portion of the layers 4 to 7 at the periphery of the wafer 1 so as to expose the locations of the channels 2. This can be done by etching the p-type capping layer 7 with a potassium iodide/iodine etch, etching the p-type passive layer 6 with a hydrochloric/phosphoric acid etch, etching, etching the active layer 5 with a nitric acid etch, and finally determining the position of the channel filled by the intermediate or guide layer 4 by etching it alternately with bromine-methanol and with hydrochloric/phosphoric acid etches. The etching of the guide layer 4 involves more complicated processing than the corresponding etching of the capping layer 7 because the guide layer composition is too close to indium phosphide to be selectively etched with a potassium iodide/iodine etch. The bromine-methanol etch is a non-selective etch that would etch both the material of the guide layer 4 and the material of the underlying substrate 1. On the other hand, the hydrochloric/phosphoric acid etch will only etch the substrate material. Therefore this etch is used to test whether or not the previous etching, the bromine-methanol etch, has proceeded deep enough to expose any substrate material. Once the guide layer 4 has been breached, the hydrochloric/phosphoric acid etch serves to reveal the channels 2 in reverse relief.

Once the windows 9 have been opened in the silica mask layer 8, a short zinc diffusion is performed to produce a p+ region immediately under the window 9 for facilitating the making of a good electrical connection with the capping layer 7. The device is then thinned to reduce the substrate thickness to approximately 80 microns before the application of metal contact layers 10 and 11, which are evaporated and alloyed contacts, respectively.

In a modification of the above described method of manufacture a 4:1 phosphoric:hydrochloric acid etch is substituted for the 1:1 phosphoric:hydrobromic acid etch when etching the channels 2 in the indium phosphide substrate 1. This produces (01$\bar{1}$) and (0$\bar{1}$1) side walls 3 to the channels 2 instead of the B plane walls.

It is also possible to redesign the structure so as to be able to use a p-type substrate. This entails growing each of the epitaxial layers in material of the opposite conductivity type to that used with the n-type substrate.

While I have described above the principles of my invention in connection with specific laser constructions, it is to be clearly understood that this description is made only by way of example and not as a limitation to the scope of my invention as set forth in the objects thereof and in the accompanying claims.

I claim:

1. In a method of producing an inverted rib waveguide laser including an InP substrate having a (100) surface and an (In,Ga)(As,P) active layer, the improvement comprising the steps of forming at the (100) surface of the substrate a channel extending in the [011] direction by an etching process producing side walls of the channel that differ from A-planes;

epitaxially growing an intermediate layer of an (In,Ga)(As,P) material with a band gap larger than that of the active layer by liquid phase epitaxy in the channel and on the (100) surface of the substrate to thereby form a rib filling the channel and providing a measure of dielectric waveguiding effect for the laser in the lateral directions, with the growth within and at the region substantially juxtaposed with the channel being accelerated relative to that on the (100) surface of the substrate due to the crystallographic orientations of the side walls so that that surface of the intermediate layer that is remote from and faces away from the substrate becomes substantially flat even when the thickness of the intermediate layer outside said region is still relatively small; and providing the active layer on the substantially flat remote surface of the intermediate layer by liquid phase epitaxy.

2. The method as defined in claim 1, wherein said forming step includes using an etch that gives the side walls of the channel orientations substantially in {111}B planes.

3. The method as defined in claim 1, wherein said forming step includes using an etch that gives the side walls of the channel orientations substantially in {011} planes.

* * * * *